(12) United States Patent
Itkin

(10) Patent No.: US 8,831,159 B2
(45) Date of Patent: Sep. 9, 2014

(54) AM-PM SYNCHRONIZATION UNIT

(75) Inventor: Grigory Itkin, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 432 days.

(21) Appl. No.: 13/023,688

(22) Filed: Feb. 9, 2011

(65) Prior Publication Data

US 2012/0201337 A1 Aug. 9, 2012

(51) Int. Cl.
*H04L 7/033* (2006.01)
*H04L 27/36* (2006.01)
*H03F 3/24* (2006.01)
*H03C 5/00* (2006.01)

(52) U.S. Cl.
CPC ............... *H03F 3/24* (2013.01); *H04L 27/366* (2013.01); *H03F 2200/324* (2013.01); *H04L 27/361* (2013.01); *H03C 5/00* (2013.01); *H03F 2200/451* (2013.01)
USPC ........................................................ 375/359

(58) Field of Classification Search
CPC ................................. H04L 7/033; H04L 7/027
USPC ................. 375/308, 295, 296, 300, 302, 359; 455/102, 126, 127
See application file for complete search history.

(56) References Cited

U.S. PATENT DOCUMENTS

| | | | | |
|---|---|---|---|---|
| 4,644,531 A * | 2/1987 | Sasaki | | 370/458 |
| 6,795,496 B1 * | 9/2004 | Soma et al. | | 375/226 |
| 6,931,240 B2 * | 8/2005 | Hunton | | 455/130 |
| 7,126,999 B2 * | 10/2006 | Dent | | 375/261 |
| 7,276,985 B2 * | 10/2007 | Hirano | | 332/128 |
| 7,333,780 B2 * | 2/2008 | Udagawa et al. | | 455/126 |
| 7,706,495 B2 * | 4/2010 | Hirano et al. | | 375/373 |
| 7,813,444 B2 * | 10/2010 | Shakeshaft | | 375/295 |
| 7,872,545 B2 * | 1/2011 | Wilhelm | | 332/103 |
| 8,130,865 B2 * | 3/2012 | Schimper et al. | | 375/296 |
| 8,243,854 B2 * | 8/2012 | Ikedo | | 375/300 |
| 2004/0208157 A1 * | 10/2004 | Sander et al. | | 370/345 |
| 2005/0046507 A1 * | 3/2005 | Dent | | 332/103 |
| 2005/0134396 A1 * | 6/2005 | Pehlke et al. | | 332/103 |
| 2005/0136858 A1 * | 6/2005 | Zipper | | 455/102 |
| 2005/0245208 A1 * | 11/2005 | Udagawa et al. | | 455/102 |
| 2006/0154626 A1 * | 7/2006 | Maerzinger et al. | | 455/127.1 |
| 2006/0171484 A1 * | 8/2006 | Puma | | 375/295 |

(Continued)

FOREIGN PATENT DOCUMENTS

DE 102008046832 A1 4/2009
DE 102009029425 B4 4/2010

*Primary Examiner* — Daniel Washburn
*Assistant Examiner* — Berhanu Tadese
(74) *Attorney, Agent, or Firm* — Eschweiler & Associates, LLC

(57) ABSTRACT

One embodiment of the present invention relates to a method and apparatus for performing both phase modulation (PM) and amplitude modulation (AM) downstream of a controlled oscillator (e.g., by providing a baseband signal having no phase modulation to a controlled oscillator and performing phase modulation on a high frequency RF signal output from the oscillator), wherein the amplitude modulation is synchronized with the phase modulation. In one particular embodiment, the method and apparatus synchronize modulation of AM and PM signal paths in a manner that provides a polar modulated signal having an amplitude of zero at a symbol boundary (e.g., a transition between different symbols) having a phase of zero (e.g., a phase that crosses through a zero crossing point).

17 Claims, 9 Drawing Sheets

(56) References Cited

U.S. PATENT DOCUMENTS

| | | | |
|---|---|---|---|
| 2006/0276143 A1* | 12/2006 | Anglin | 455/81 |
| 2006/0291589 A1* | 12/2006 | Eliezer et al. | 375/302 |
| 2007/0237258 A1* | 10/2007 | Shakeshaft | 375/296 |
| 2009/0004981 A1* | 1/2009 | Eliezer et al. | 455/127.1 |
| 2009/0110033 A1* | 4/2009 | Shattil | 375/141 |
| 2009/0252255 A1* | 10/2009 | Lee et al. | 375/297 |
| 2009/0258612 A1* | 10/2009 | Zhuang et al. | 455/110 |
| 2010/0067617 A1* | 3/2010 | Wilhelm | 375/308 |
| 2011/0084777 A1* | 4/2011 | Wilhelm | 332/103 |
| 2011/0103508 A1* | 5/2011 | Mu et al. | 375/295 |
| 2012/0082265 A1* | 4/2012 | Ikedo | 375/300 |

\* cited by examiner

1000

1100

AM-PM SYNCHRONIZATION UNIT

BACKGROUND

During wireless communication, a wireless transmitter can encode a message as a digital bit stream (e.g., a stream of logical "1"s and "0"s), and then modulate the digital bit stream onto a carrier wave to generate a stream of symbols. This stream of symbols is then transmitted to an intended wireless receiver through the transmission medium (e.g., through the atmosphere). Upon accurately receiving the stream of symbols, the intended wireless receiver demodulates the symbols and provides the originally transmitted digital bit stream to an end user, often via an audio and/or visual display (e.g., LCD screen and/or speaker).

In carrying out such wireless communication, one type of modulation that the wireless devices can use is polar modulation, wherein amplitude and phase components of a waveform are separated for modulation. FIG. 1a shows an example of a conventional polar modulation circuit that includes a baseband processor 102, a controlled oscillator 104 (e.g., a voltage controlled oscillator or a digitally controlled oscillator), and an amplitude modulation unit 106. The controlled oscillator 104 is configured to generate a high frequency phase modulated (PM) carrier signal, to which amplitude modulation is introduced by providing an amplitude modulated control signal $AM_{HF}$ to the amplitude modulation unit 106. As discussed in more detail below, these components work in coordinated fashion to modulate a digital bit stream onto a carrier wave as a stream of symbols, thereby enabling wireless transmission via an antenna 108.

As one of ordinary skill in the art appreciates, symbols are somewhat akin to an alphabet for communicating wireless devices, in that each symbol has a unique waveform that is different from waveforms of other respective symbols. Symbols often have a unique frequency, amplitude, and/or phase offset relative to other symbols, wherein the phase offset if generally measured relative to a carrier wave known to a transmitter and receiver.

To illustrate one example of how symbols can be used to transmit a digital bit stream, FIG. 1b shows a voltage vs. time plot for two symbols consistent with a binary phase shift keying (BPSK) scheme. Relative to a carrier wave with a 0° phase offset, the first symbol (which can be assigned to a logical "1") is transmitted with a 45° phase offset. The second symbol (which can be assigned to a logical "0") is transmitted with a 225° phase offset relative to the carrier wave with 0° phase offset. FIG. 1c shows a phase plot of these symbols. Consistent with FIG. 1c, the first symbol is characterized by a phase offset of 45° and the second symbol is characterized by a phase offset of 225°, wherein both symbols have the same magnitude as evidenced by their equal radii as measured from the origin, which may also be referred to as a "zero crossing point."

FIG. 1d shows an example of how the symbols of FIGS. 1b-1c can be utilized to transmit a digital bit stream (e.g., a digital bit stream of "101100"). As shown, symbols are transmitted during respective symbol periods. For example, the first symbol (e.g., corresponding to a logical "1" value), is transmitted during a first symbol period extending from $TS_0$ to $TS_1$; the second symbol (e.g., corresponding to a logical "0") is transmitted during a second symbol period extending from $TS_1$ to $TS_2$; and so on.

As can be seen from the bottom waveform of FIG. 1d (DCO FREQ), a large change in VCO/DCO oscillator frequency is required at symbol boundaries where a 180° phase change occurs. For example, at symbol boundary $TS_1$ the polar modulation transmitter attempts to induce an 180° phase shift to change between the first symbol (used just prior to symbol boundary $TS_1$) and the second symbol (used just after symbol boundary $TS_1$). Because this 180° phase shift requires a near infinite oscillator frequency change, which is difficult to achieve with the limited frequency tuning range that a controlled oscillator allows, polar modulation is difficult to implement.

Hence, the present disclose has developed improved techniques for performing polar modulation. Among other advantages, at least some of these techniques make 180° phase shifts between adjacent symbols easier to achieve compared to conventional techniques.

BRIEF DESCRIPTION OF THE DRAWINGS

FIG. 7b illustrates a signal diagram showing some signals present in the polar modulation circuit of FIG. 7a.

DETAILED DESCRIPTION

Figure 1A:
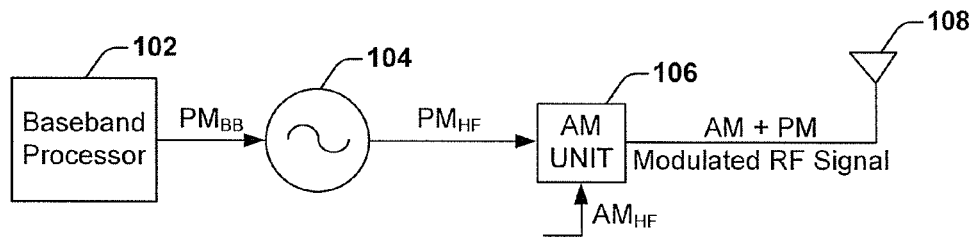
FIG. 1a illustrates a block diagram of an exemplary prior art polar modulation circuit.
Figure 1B:
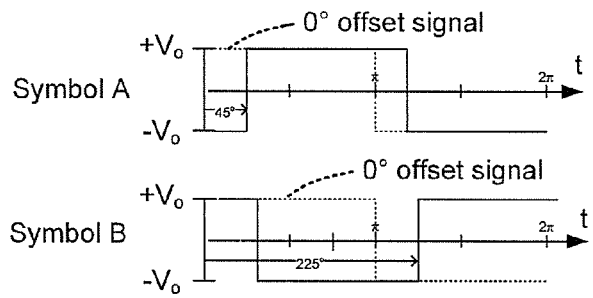
FIG. 1b shows a voltage vs. time plot for two symbols consistent with a binary phase shift keying (BPSK) scheme.
Figure 1C:
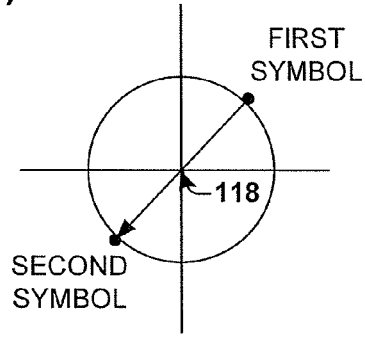
FIG. 1c illustrates a phase plot of the two symbols shown in FIG. 1b.
Figure 1D:
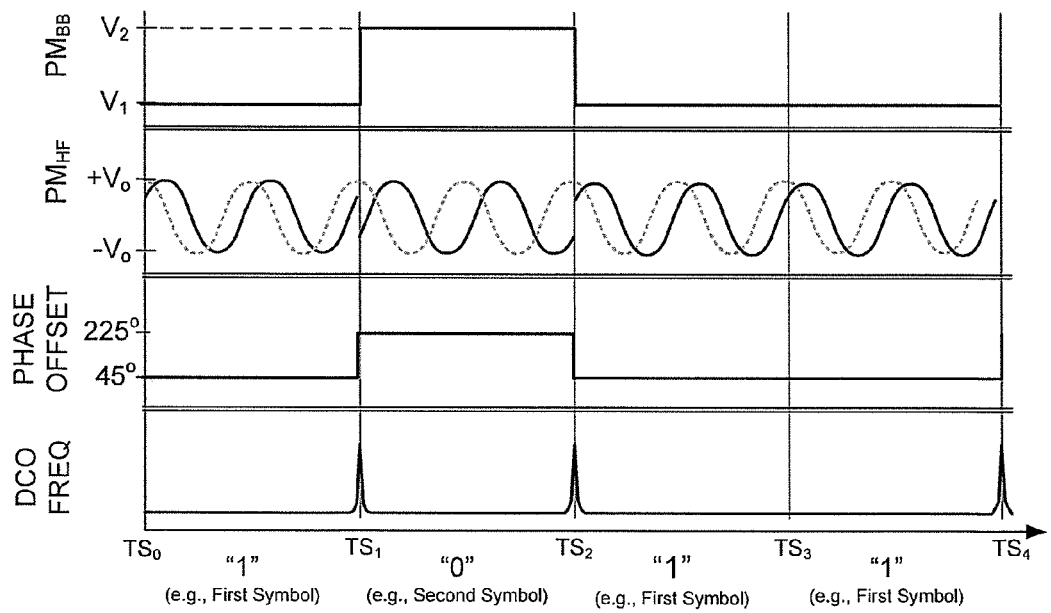
FIG. 1d illustrates signal diagrams showing how symbols are transmitted as bit stream in a polar modulation circuit.

The present invention will now be described with reference to the attached drawing figures, wherein like reference numerals are used to refer to like elements throughout, and wherein the illustrated structures and devices are not necessarily drawn to scale.

Some aspects of the present disclosure provide for a polar modulation circuit configured to perform both phase modulation (PM) and amplitude modulation (AM) downstream of a controlled oscillator (i.e., at a high frequency), wherein the amplitude modulation is synchronized with the phase modulation. In one particular embodiment, the method and apparatus synchronize high frequency modulation of AM and PM signal paths in a manner that provides a polar modulated signal having an amplitude of zero at a symbol boundary (e.g., a transition between different symbols) having a 180° change in phase (e.g., a phase that crosses through a zero crossing point).

For example, in one embodiment, a phase regulator may regulate the phase modulation of a PM baseband signal to generate a phase regulated baseband signal that is provided to a controlled oscillator. Based upon the phase regulated baseband signal, the controlled oscillator generates a high frequency carrier wave to which phase modulation may be introduced downstream of the oscillator. To synchronize the introduction of phase modulation with amplitude modulation, an amplitude conversion component may be configured to interpolate a received baseband amplitude modulated (AM) signal to generate a high frequency interpolated AM signal having an amplitude that is substantially zero at a switching point time. The amplitude conversion component triggers operation of a phase modulation component to introduce a phase modulation into a high frequency PM signal at the switching point time, thereby causing the high frequency interpolated AM signal to have a zero amplitude when a high frequency phase offset is introduced to perform phase modulation (e.g., when a zero crossing point is generated in the high frequency PM signal).

Figure 2:
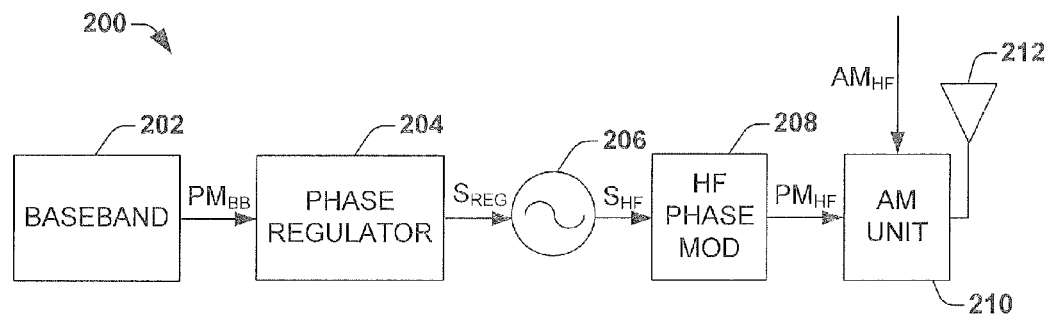
FIG. 2 illustrates a block diagram of a first embodiment of polar modulation circuit configured to perform synchronous AM and PM modulation downstream of a controlled oscillator.

FIG. 2 shows a block diagram of an example of a disclosed polar modulation circuit 200. The circuit 200 comprises a baseband processor 202 configured to provide a PM baseband signal $PM_{BB}$ to a phase regulator 204. The phase regulator 204 may regulate phase modulation information (e.g., remove changes in phase offset, at symbol boundaries, having an absolute value greater than 90°) in the PM baseband signal prior to the signal reaching a controlled oscillator 206. The controlled oscillator 206 is configured to generate a high frequency carrier signal $S_{HF}$. The high frequency carrier signal $S_{HF}$ is provided to a high frequency phase modulation component 208 that may introduce a phase modulation (e.g., additional phase modulation) into the high frequency carrier signal $S_{HF}$ to generate a high frequency phase modulated signal $PM_{HF}$, comprising phase modulation information that differentiates between different symbols.

The high frequency phase modulated signal $PM_{HF}$ is input to a amplitude modulation unit 210, controlled by a high frequency amplitude modulated signal $AM_{HF}$, which introduces amplitude modulation into the high frequency PM carrier signal $PM_{HF}$, in a manner that synchronizes the phase and amplitude modulation at symbol boundaries (e.g., causes $AM_{HF}$ to have a zero amplitude when $PM_{HF}$ has a phase change of 180°). Therefore, polar modulation circuit 200 is configured to perform both phase modulation and amplitude modulation downstream of a controlled oscillator, in a manner that synchronizes the phase and amplitude modulation.

It will be appreciated that as provided herein, regulating phase modulation information (e.g., generating a phase regulated signal, as done by phase regulator 204) may comprise making changes in phase that are designed to remove phase shifts from a PM baseband signal that are difficult for a controlled oscillator to implement (e.g., greater than 90°). For example, in one embodiment regulation of phase modulation information may comprise removing phase modulation information by introducing a phase shift into the $PM_{BB}$ signal that results in a constant phase signal (e.g., introducing a 180° phase shift into a signal that modulates between a 45° and 225° phase offset). In alternative embodiments, regulating phase modulation information may comprise introducing a digital phase offset (relative to a previous symbol) into the $PM_{BB}$ while the high frequency phase modulator is configured to introduce an additional high frequency phase offset (e.g., of 180°) into the high frequency PM carrier signal. The resulting phase modulation of the $PM_{HF}$ signal is a cumulative phase modulation due to both the digital phase modulation and the high frequency phase modulation.

For example, in the case of a first symbol comprising a phase offset of 315° and a second adjacent symbol desiring a phase offset of 90°, a 135° change in phase offset is made. As provided herein, to generate the 135° change in phase offset a phase regulator may generate a phase regulated signal having a digital phase offset of −45° relative to the first symbol, while a high frequency phase modulator may introduce a phase offset of 180°, thereby resulting in an overall change in phase offset of 135° between the first and second symbols. The use of both the digital phase modulation and the high frequency phase modulation allow for a symbol to be phase modulated with respect to a previous symbol at various phase offsets (e.g., 45°, 90°, 135°, 180°, 225°, etc.) without driving a controlled oscillator with a signal having a large change in phase offset (e.g., a phase offset change between adjacent symbols having an absolute value of greater than 90°).

Figure 3:
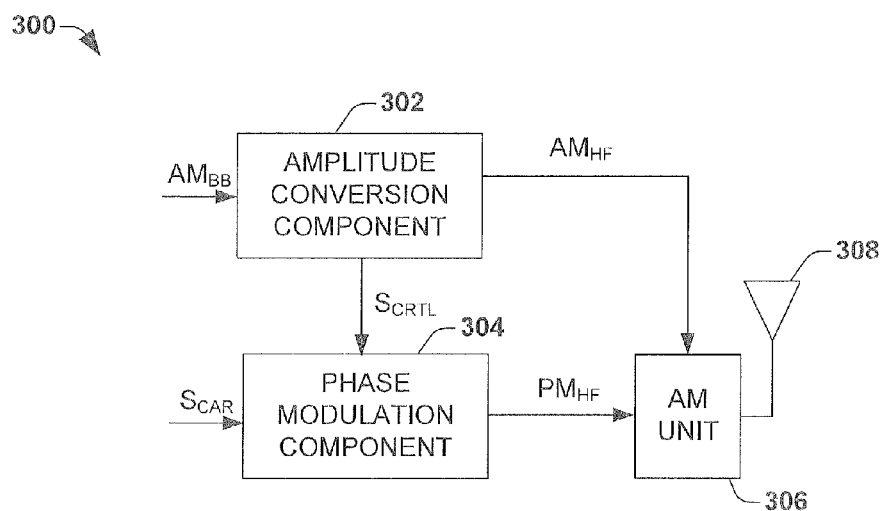
FIG. 3 illustrates a block diagram of another embodiment of a polar modulation circuit configured to perform synchronous AM and PM modulation.

FIG. 3 illustrates a block diagram of another embodiment of a polar modulation circuit 300 as provided herein, comprising an amplitude conversion component 302 and a phase modulation component 304. The amplitude conversion component 302 is configured to generate a high frequency amplitude modulated signal $AM_{HF}$ having an amplitude that is substantially zero at a switching point time that corresponds to a phase shift of 180° in a phase modulated baseband signal. The amplitude conversion component 302 is further configured to generate a control signal $S_{CTRL}$ at the switching point time. The phase modulation component 304 is configured to receive the control signal $S_{CTRL}$ and based thereupon to generate a high frequency phase modulated carrier signal $PM_{HF}$ by introducing a high frequency phase modulation into a high frequency carrier signal $S_{CAR}$. An amplitude modulation unit 306 (e.g., TX mixer, power amplifier) introduces amplitude modulation into the high frequency PM carrier signal $PM_{HF}$ so that the polar modulated signal output from the amplitude modulation unit 306 has a zero amplitude when the phase is changed by 180°.

Figure 4:
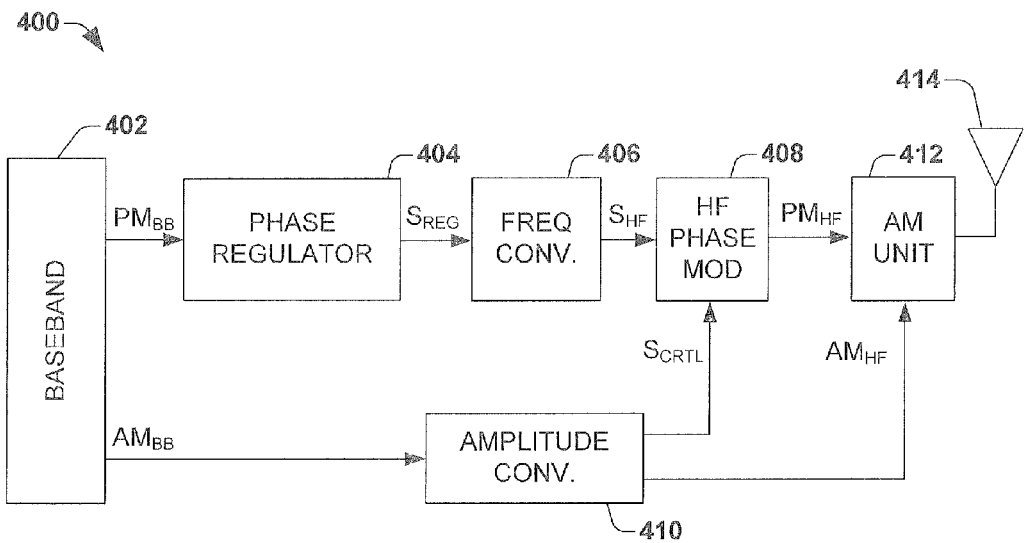
FIG. 4 illustrates a block diagram of a more particular embodiment of a polar modulation circuit configured to perform synchronous AM and PM modulation.

FIG. 4 illustrates a block diagram of a more particular embodiment of a polar modulation circuit 400. As shown in FIG. 4, the polar modulation circuit 400 comprises a phase modulated (PM) signal path and an amplitude modulated (AM) signal path.

The PM signal path comprises a phase regulator 404, a frequency converter 406, and a high frequency phase modulator 408. The phase regulator 404 is configured to regulate phase modulation (e.g., remove phase changes of 180°) of the PM baseband signal, by shifting the phase of one or more symbols in the PM baseband signal $PM_{BB}$. For example, upon detection of a phase change of 180° in $PM_{BB}$, phase regulator 404 may introduce a phase shift of 180° into $PM_{BB}$ to remove the phase offset change. A resultant phase regulated baseband signal $S_{REG}$ (e.g., having a constant phase offset and some frequency) is provided to the frequency converter 406 (e.g., voltage controlled oscillator, digitally controlled oscillator), so that the frequency converter 406 does not see large phase offset changes (e.g., zero crossing points).

Based upon the received phase regulated signal $S_{REG}$ the frequency converter 406 generates a high frequency carrier signal $S_{HF}$ (e.g., an RF signal) that is output to the high frequency phase modulator 408. The high frequency phase modulator 408 is configured to introduce a high frequency phase offset in the high frequency signal (e.g., 180° phase offset), to generate a high frequency PM carrier signal differentiating between symbols through phase modulation. For example, in one embodiment a constant phase, high frequency carrier signal $S_{HF}$ having a constant phase offset of 45° (associated with a first symbol) may be provided to the high frequency phase modulator 408. The high frequency phase modulator 408 may selectively introduce a phase offset of 180° to the constant 45° phase offset to generate a 225° phase offset (associated with a second symbol). Therefore, the selective introduction of a phase offset introduces phase modulation into the high frequency constant phase carrier signal $S_{HF}$ allows differentiation between a first symbol having a phase offset of 45° and a second symbols having a phase offset of 225°.

The AM signal path comprises an amplitude conversion component 410 configured to receive an amplitude modulated baseband signal $AM_{BB}$ and therefrom to generate a high frequency amplitude modulated signal $AM_{HF}$. The amplitude conversion component 410 is further configured to generate a control signal $S_{CTRL}$, which is provided to the high frequency phase modulator 408 to trigger the high frequency phase modulator 408 to introduce a phase offset into the high frequency carrier signal at a switching point time (e.g., the generation of the high frequency phase modulated signal $PM_{BB}$). Therefore, synchronization between the AM and the PM signal paths is obtained by controlling operation of the high frequency phase modulator 408, to reintroduce phase modulation into the high frequency carrier signal $S_{HF}$, with a control signal $S_{CTRL}$ that is generated by and sent from the amplitude conversion component 410 at a time when a symbol transition having a phase shift of 180° (e.g., from a first symbols having a 45° phase offset to a second symbol having a 225° phase offset) is to occur.

In one embodiment, the amplitude conversion component 410 may comprise a magnitude interpolator configured to receive samples of an AM baseband signal $AM_{BB}$. The magnitude interpolator up-converts the amplitude of the AM baseband signal $AM_{BB}$ (having a low number of amplitude samples) to a high frequency AM signal $AM_{HF}$ (having a higher number of amplitude data points) by interpolating the AM baseband signal samples to generate an interpolated, high frequency AM signal having a plurality of interpolated samples. The interpolation is performed such that the plurality of interpolated samples comprises a zero amplitude interpolated data point located between a first sample taken at a first time and a second sample taken at a second time, wherein a symbol transition having a phase shift of 180° (e.g., changing from a first symbol to a second symbol through a zero crossing point) in the PM baseband signal occurred between the first and second time. For example, the amplitude conversion component 410 may receive a first AM baseband signal sample and a second AM baseband signal sample, later in time than the first sample, from the baseband processor 402. If the PM signal samples have a corresponding phase shift of 180° between them in time, the amplitude conversion component 410 may interpolate data points in-between the two AM signal samples to achieve a zero amplitude point.

At the moment that the amplitude of the interpolated, high frequency AM signal $AM_{HF}$ is zero, the amplitude conversion component 410 is configured to generate a control signal $S_{CTRL}$ that is sent to the high frequency phase modulator 408 that causes phase modulation to be introduced into the high frequency carrier signal $S_{HF}$ (e.g., to introduce a phase offset into the high frequency signal $S_{HF}$ to generate a high frequency PM carrier signal $PM_{HF}$). The high frequency AM signal $AM_{HF}$ may be reapplied to the high frequency PM signal $PM_{HF}$ by an amplitude modulation unit 412 controlled by the high frequency AM signal $AM_{HF}$ prior to being output by an antenna 414.

Therefore, as shown in FIG. 4, the amplitude conversion component 410 may interpolate the amplitude samples of $AM_{BB}$ to introduce a zero amplitude point that corresponds to the zero signal crossing point (i.e., 180° phase change) at a symbol boundary of the high frequency PM carrier signal.

Figure 5:
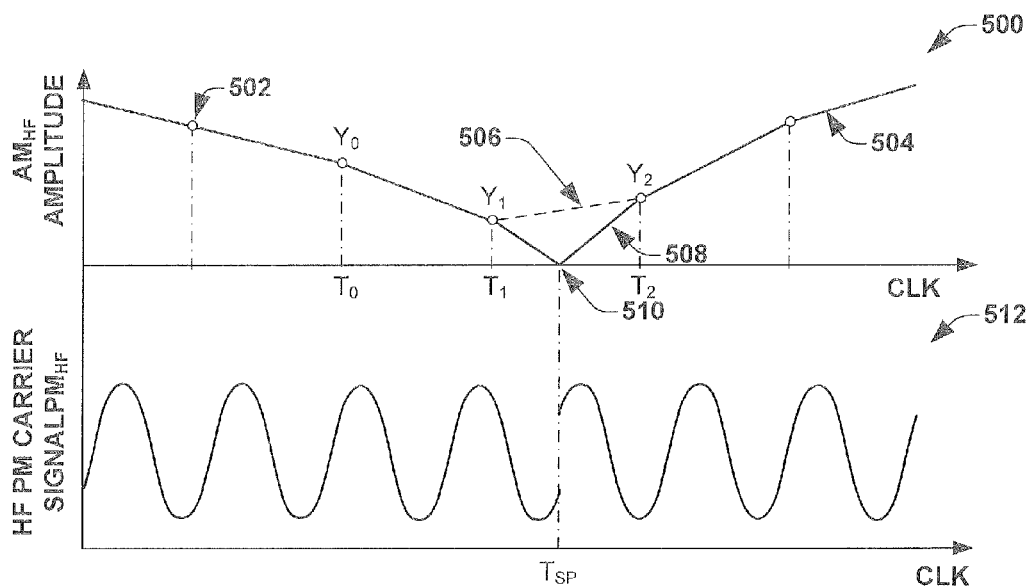
FIG. 5 illustrates graphs showing an exemplary interpolated AM signal configured to have a zero amplitude at a symbol transition having a 180° phase shift in a high frequency PM carrier signal.

FIG. 5 illustrates graphs showing synchronization between an exemplary interpolated high frequency AM signal and a high frequency PM carrier signal. Graph 500 shows one example of an interpolated high frequency AM signal configured to have an amplitude of zero in an interval between samples corresponding to a time of a zero crossing point (e.g., 180° phase shift) in a PM baseband signal. In graph 500 a plurality of samples 502, taken from an AM baseband signal, are interpolated to generate a high frequency AM signal 504. Typically, standard interpolation of the plurality of samples 502 results in AM signal that follows line 506 between samples $Y_1$ and $Y_2$, wherein the interpolation amplitude goes from sample $Y_1$ to sample $Y_2$ without crossing zero. However, as provided herein, if a zero crossing point is detected in the PM baseband signal at a time between samples $Y_1$ and $Y_2$; since there is no information between the samples, interpolation can be used to find the location of the zero point. Therefore, the standard interpolation (line 506) may be modified to generate a high frequency AM signal that follows line 508 between samples $Y_1$ and $Y_2$, wherein line 508 has a zero amplitude value 510 at a switching point time $T_{SP}$.

As shown in graph 512, at the switching point time $T_{SP}$, a phase offset is introduced into a high frequency carrier signal $S_{HF}$ (e.g., a constant phase, high frequency carrier signal) to generate a high frequency PM carrier signal$_{PMHF}$. Since the introduction of phase modulation information (e.g., a phase offset) into a high frequency carrier signal $S_{HF}$ is based upon the switching time that the $AM_{HF}$ amplitude is zero, synchronization is achieved between the $AM_{HF}$ and $PM_{HF}$ signals.

Therefore, as illustrated in FIGS. 4-5, the polar modulation circuit 400 provides for synchronization between the AM path and the PM path by triggering the introduction of a phase modulation (e.g., a 180° phase shift) into a high frequency carrier signal at a moment when an interpolated, high frequency AM signal has an amplitude of zero.

Figure 6:
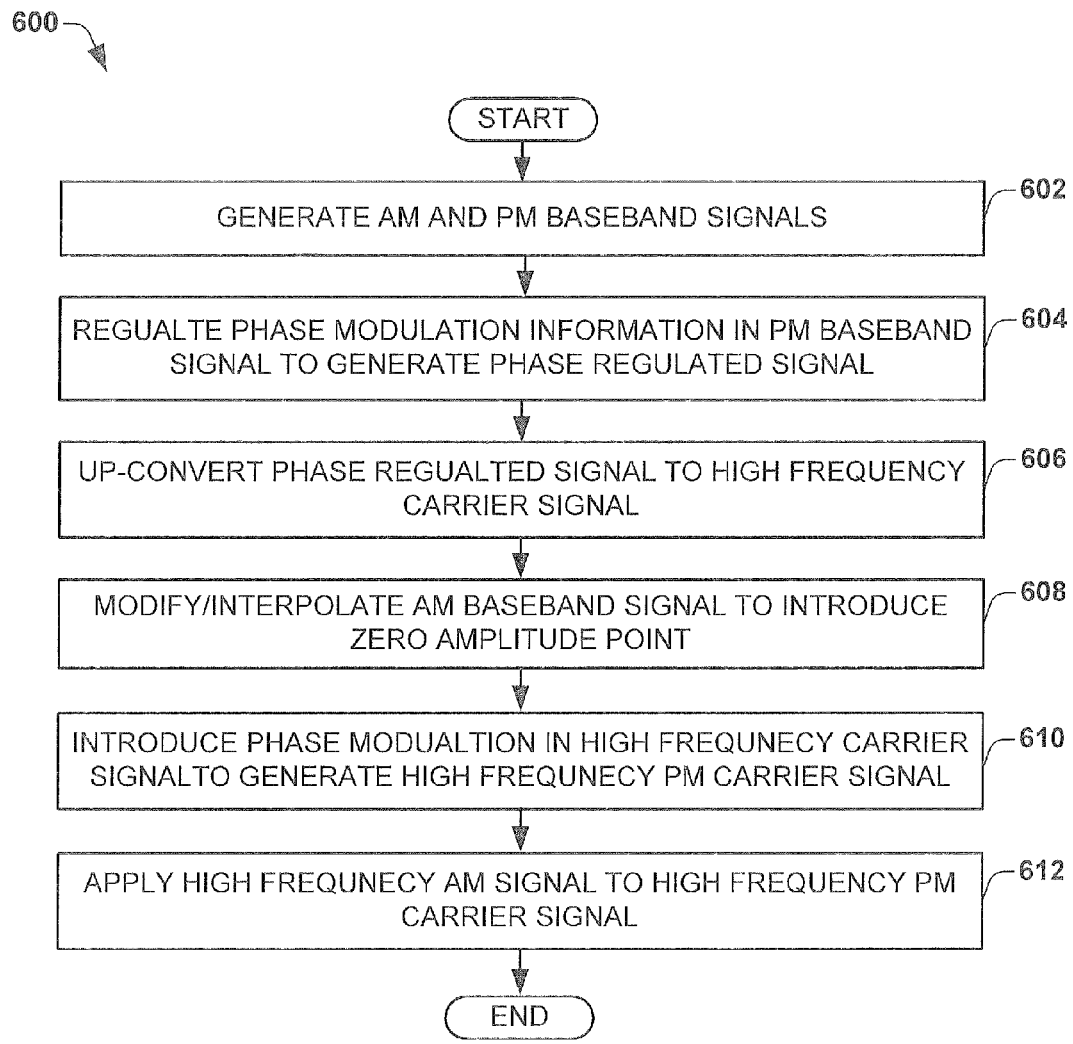
FIG. 6 is a flow diagram showing an exemplary method for synchronization of an interpolated high frequency AM signal and a high frequency PM carrier signal.

FIG. 6 illustrates an exemplary method 600 for synchronization of an interpolated high frequency AM signal and a high frequency PM carrier signal. While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 2, 3, 4, etc.

are non-limiting examples of circuits that may be used to implement method 600). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 602 an amplitude modulated (AM) baseband signal and a phase modulated (PM) baseband signal are generated. In one embodiment, in-phase (I) and quadrature phase (Q) samples, generated in a digital baseband processor, may be converted by a coordinate rotation digital computer (CORDIC) algorithm into the baseband AM and PM signals.

At 604 phase modulation information is regulated in a PM baseband signal to generate a phase regulated signal. In one example, upon detection of a symbol transition having a phase change of 180° (e.g., zero crossing point), a phase shift of 180° is introduced into the PM baseband signal to remove the phase offset change from the PM baseband signal, resulting in a phase regulated signal having a constant phase offset and some frequency. In one embodiment, the symbol transition may be detected by comparing the phase of the PM baseband signal at different (e.g., adjacent) clock periods. If a sufficiently large phase difference is detected, it is indicative of the presence of a symbol transition having an 180° phase change (e.g., a zero crossing point).

The phase regulated signal is up-converted to a high frequency carrier signal at 606. In one embodiment the phase regulated signal is provided to a DCO/VCO for up-conversion. The regulation of the phase regulated signal ensures that a controlled oscillator does not see large phase discontinuities (e.g., zero crossings point) that will be difficult for the controlled oscillator to implement.

At 608 the AM baseband signal is modified to introduce a zero amplitude point corresponding to a large change in phase (e.g., having an absolute value greater than 90°) in the PM baseband signal. In one embodiment, samples of the AM baseband signal are interpolated to generate a high frequency AM signal having a zero amplitude point at a switching point time when the phase modulated baseband signal has a phase change of 180°. In particular, if a symbol transition (e.g., a change in phase offset causing the PM baseband signal to pass through zero crossing point) in the PM baseband signal is detected (e.g., at 404) at a time between which two baseband AM signal samples are taken, interpolation can be used to find a zero amplitude temporal location between the two AM signal samples.

At 610 phase modulation is introduced into the high frequency carrier signal, at the time the high frequency AM signal has a zero amplitude, to generate a high frequency PM carrier signal. In one embodiment, the phase modulation is triggered to occur (e.g., by a control signal) at the time that the baseband AM component is at a zero amplitude point, so that the high frequency AM signal has a zero amplitude at the same time that the high frequency PM carrier signal undergoes a the phase change of 180°. Phase modulation may comprise the introduction of a phase offset into the high frequency signal so as to generate a high frequency PM signal that is able to differentiate between one or more symbols through phase modulation.

At 612 the high frequency interpolated AM signal is applied to the high frequency PM carrier signal to generate a high frequency polar modulated signal.

Figure 7A:
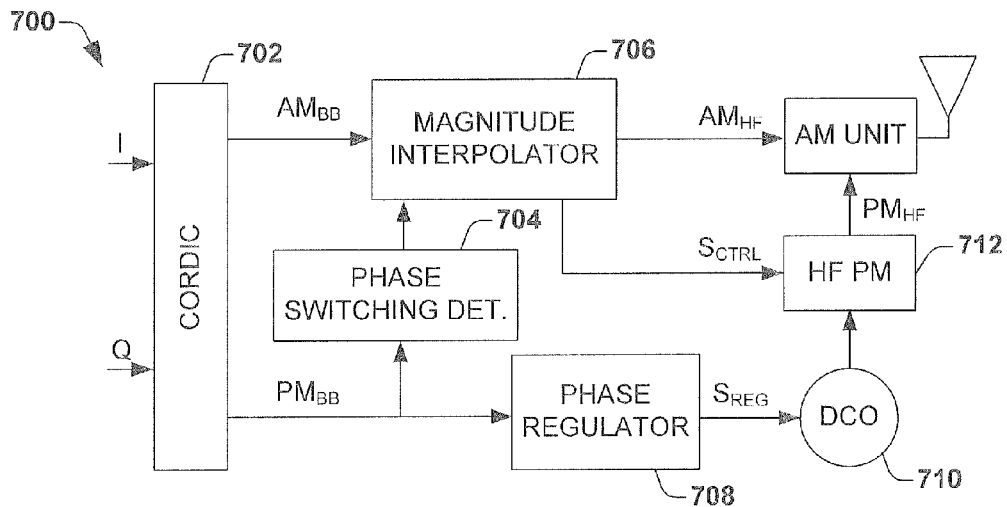
FIG. 7a illustrates a block diagram of a more detailed embodiment of a polar modulation circuit configured to perform synchronous AM and PM modulation.
Figure 7B:
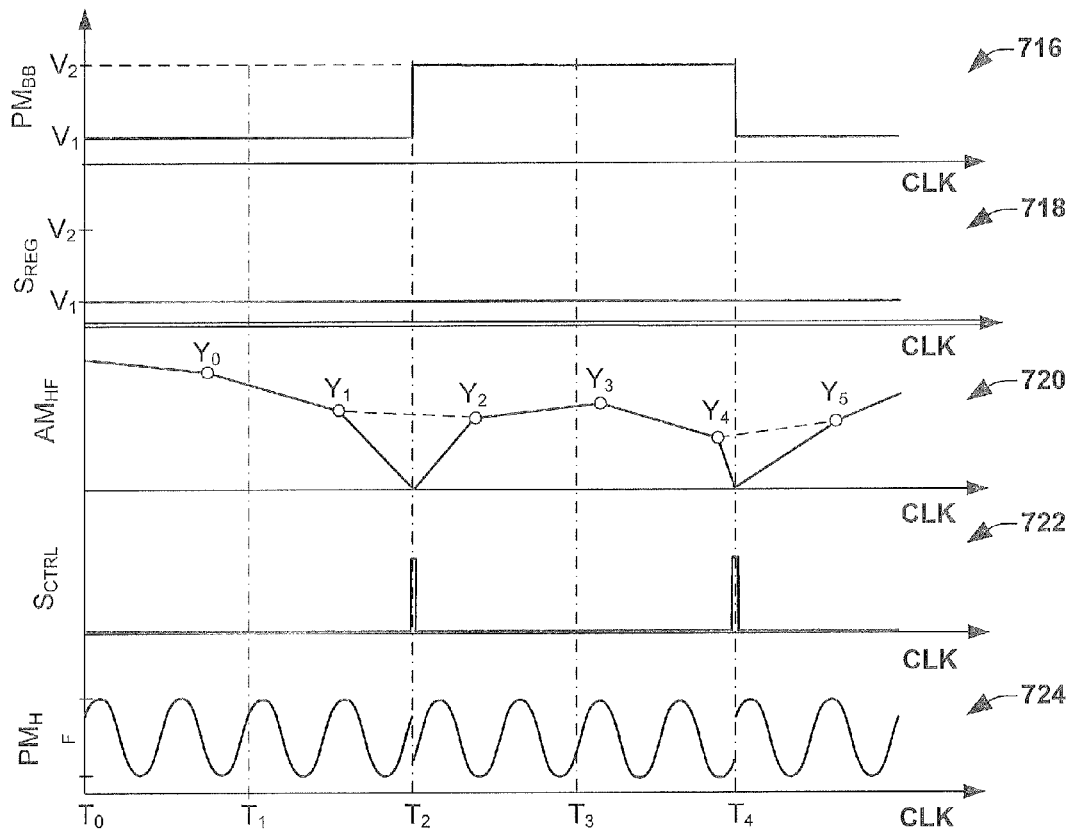

FIGS. 7a-7b illustrate a more detailed example of a polar modulation circuit configured to perform synchronous AM and PM modulation. In particular, FIG. 7a illustrates a block diagram of polar modulation circuit 700 configured to perform synchronous AM and PM modulation, while FIG. 7b illustrates associated signal diagrams showing some signals present in the circuit 700.

Referring to FIG. 7a, the polar modulation circuit 700 comprises a coordinate rotation digital computer (CORDIC) 702 configured to receive in-phase (I) and quadrature phase (Q) signals (e.g., generated by a digital baseband processor) and to generate therefrom an AM baseband signal $AM_{BB}$ and a PM baseband signal $PM_{BB}$.

The PM baseband signal $PM_{BB}$ comprises a phase modulated baseband signal comprising phase offset information (e.g., phase offset values 45° and 225°) that is used to distinguish between transmitted symbols. As shown in FIG. 7b, between a time $T_0$ and $T_1$ the PM baseband signal has a voltage value $V_1$ that corresponds to a 45° phase offset with respect to a carrier signal having a 0° phase offset, thereby indicating a first symbol (e.g., a logical "0"). At time $T_2$ the PM baseband signal is increased to a second voltage value $V_2$ that introduces a phase offset so that the signal between time $T_2$ and $T_3$ that corresponds to a 225° phase offset with respect to the carrier signal having a 0° phase offset, thereby indicating a second symbol (e.g., a logical "1").

The PM baseband signal $PM_{BB}$ is provided to a phase regulator 708 and a phase switching detector 704. The phase switching detector 704 is configured to detect transitions between symbols that cause an 180° phase change (e.g., the signal to pass through a zero crossing point). In one embodiment, the phase switching detector 704 may be configured to detect a transition between symbols by detecting a phase difference between PM baseband signal samples that are shifted in time (e.g., separated by one clock period) with respect to each other. The phase regulator 708 is configured to regulate phase modulation (e.g., remove 180° phase offset changes located at transition points between different symbols) of the PM baseband signal $PM_{BB}$, resulting in a phase regulated baseband signal $S_{REG}$ (e.g., a phase regulated baseband signal having a constant phase). The phase regulated baseband signal $S_{REG}$ is provided to a controlled oscillator 710 that is configured to generate a high frequency carrier signal $S_{HF}$.

Referring to FIG. 7b, at a transition between first and second symbols (e.g., at time $T_2$ and $T_4$) the phase offset of the PM baseband signal $PM_{BB}$ is switched (e.g., respectively from 45° to 225° and from 225° to 45°), resulting in a zero crossing point. To produce a phase regulated baseband signal $S_{REG}$, during the transition between symbols, the phase regulator 708 will introduce a phase shift into the PM baseband signal $PM_{BB}$ to remove the zero crossing point. Therefore, the PM baseband signal $PM_{BB}$ at times $T_2$ and $T_4$ is shifted by 180° so that the zero crossing point is removed, resulting in a phase regulated baseband signal $S_{REG}$ having a single voltage value (i.e., a single phase offset value) of $V_1$.

The magnitude interpolator 706 is configured to receive samples of the AM baseband signal $AM_{BB}$. However, since the samples are at a baseband frequency (e.g., MHz) and not an RF frequency the magnitude interpolator 706 is configured to generate additional samples for the RF frequency (e.g., GHz). The magnitude interpolator 706 further receives a signal output from the phase switching detector 704 that indicates a transition between symbols causing an 180° phase change has occurred in $PM_{BB}$. Upon, receiving a signal from the phase switching detector 704, the magnitude interpolator 706 can interpolate the AM signal samples to compute a zero amplitude point at a time relating to the transition. To ensure synchronization between the PM and AM signals, the magnitude interpolator 706 is configured to generate a control signal $S_{CTRL}$, when the amplitude of the interpolated, high frequency AM signal is zero, which is sent to the high frequency phase modulator 712 to cause a phase modulation to be introduced into the high frequency carrier signal $S_{HF}$ (e.g., to cause a selective 180° phase shift in $S_{HF}$).

For example, as shown in FIG. 7b, at time $T_2$ there is an 180° change in the phase offset of the PM baseband signal. The phase offset change, detected by phase switching detector 704, causes the interpolated, high frequency AM signal $AM_{HF}$ (graph 720) to have a zero amplitude signal between samples $Y_1$ and $Y_2$. Similarly, at time $T_4$ there is a 180° phase offset change in the PM baseband signal (graph 716) that causes the interpolated, high frequency AM signal $AM_{HF}$ (graph 720) to have a zero amplitude signal between samples $Y_4$ and $Y_5$. At the moment that the amplitude of the interpolated, high frequency AM signal $AM_{HF}$ has a magnitude of zero, the magnitude interpolator 706 sends a control signal $S_{CTRL}$ (graph 722) to the high frequency phase modulator 712 to introduce a phase shift of 180° in SHF to produce a high frequency PM carrier signal having a phase modulation that differentiates between different symbols (graph 724). Therefore, a phase shift in the high frequency, phase modulated carrier $PM_{HF}$ signal (graph 724) occurs at the same time that the control signal is generated (graph 722) so as to drive synchronization between the AM and PM signal paths.

Figure 8A:
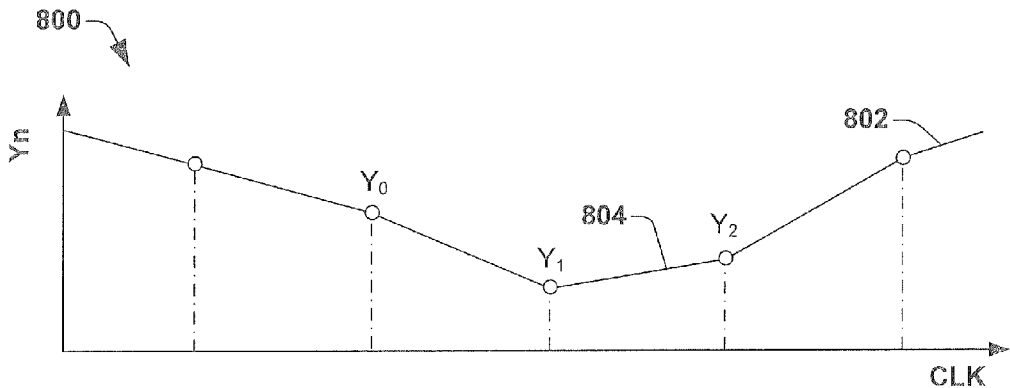
FIGS. 8a-8c illustrate signal diagrams showing more particular embodiments of amplitude interpolation as performed by a magnitude interpolator.
Figure 8B:
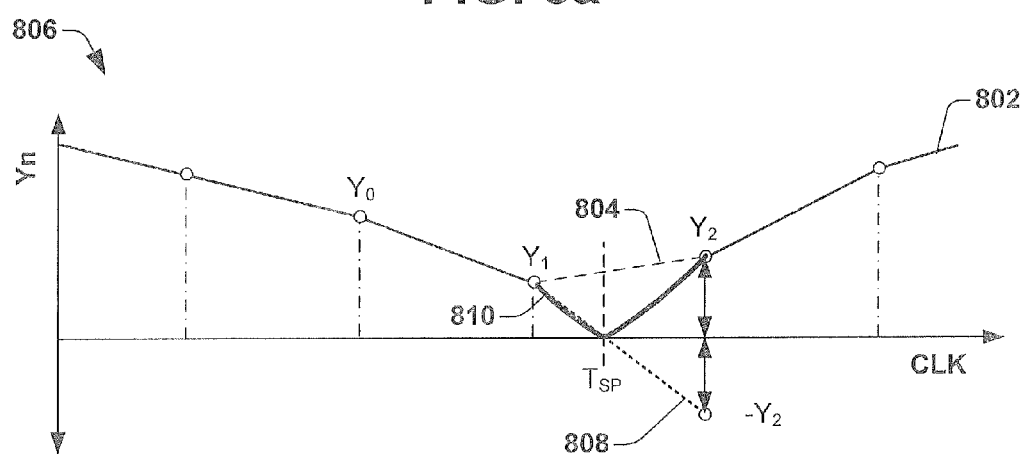
Figure 8C:
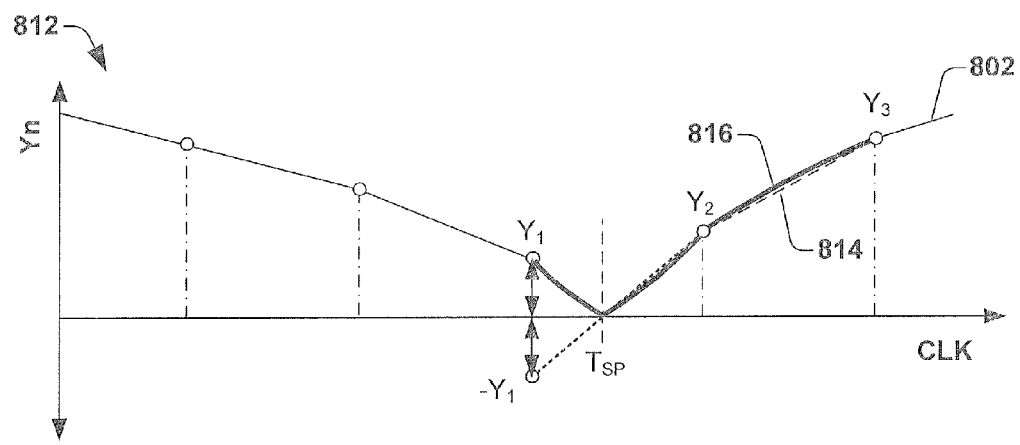

FIGS. 8a-8c illustrate signal diagrams showing a more particular embodiment of a second order amplitude interpolation as performed by a magnitude interpolator, as provided herein (e.g., corresponding to magnitude interpolator 706 in FIG. 7a).

In particular, FIG. 8a illustrates a conventional magnitude interpolation not adjusted to include a zero amplitude point (e.g., a conventional magnitude interpolation that may be performed in conjunction with the prior art polar modulation circuit shown in FIG. 1). The conventional magnitude interpolation interpolates between AM baseband samples, received from a baseband processor or CORDIC, to generate a trend line 802 that allows for conversion to an amplitude modulated signal having a higher operating frequency (e.g., an RF operating frequency). As shown in FIG. 8a, conventional magnitude interpolation results in trend line 804 extending between samples $Y_1$ and $Y_2$.

FIGS. 8b and 8c illustrate signal diagrams showing a potential embodiment of an interpolated amplitude signal configured to produce a zero amplitude point between AM baseband samples. In particular, the signal diagrams illustrate amplitude interpolation associated with an 180° phase discontinuity (e.g., zero point crossing) in the PM baseband signal at a time between AM signal samples $Y_1$ and $Y_2$. The amplitude interpolation changes the trajectory between the two samples from trend line 804 to a new trajectory that goes from the first sample to a zero amplitude point and then from the zero amplitude point to the second sample by making changes to an AM baseband samples immediately before and immediately after the switching point time $T_{SP}$. The graphs shown in FIGS. 8b and 8c respectively illustrate these changes and exemplary resultant interpolations.

As shown in graph 806 of FIG. 8b, to provide a zero amplitude signal between samples $Y_1$ and $Y_2$, the AM baseband sample immediately after the switching point time $T_{SP}$ (e.g., sample $Y_2$) can be modified. A second order interpolation (e.g., Spline interpolation) can then be calculated using the modified sample and taking the absolute function of interpolated values. In particular, the $Y_2$ sample may be replaced with its negative equivalent, $-Y_2$, so that interpolation coefficients are calculated using following combination: $Y_0, Y_1, -Y_2$. As shown in graph 806, this combination causes the interpolated line to travel along path 808. The absolute value of path 808 forms interpolated line 810 that goes from $Y_1$ to zero (at the switching point time $T_{SP}$) to $Y_2$. In one embodiment, in response to the detection of a zero crossing point in a PM baseband signal, a phase switching detector (e.g., corresponding to phase switching detector 704 in FIG. 7a) may be configured to provide a "before correction" command to a magnitude interpolation circuit. The "before correction" command causes the magnitude interpolation circuit to replace the sample immediately after the detected switching point time (e.g., sample $Y_2$) with a negative equivalent of the sample value (e.g., $-Y_2$) as described above.

Since the second order interpolation uses interpolation coefficients comprising three AM baseband samples, to generate a consistent interpolation the first interpolation interval immediately before the switching point time is also modified, as shown in graph 812 of FIG. 8c. To achieve this modification, the $Y_1$ sample may be replaced with its negative equivalent, $-Y_1$, so that interpolation coefficients are calculated using following combination: $-Y_1, Y_2, Y_3$. As shown in graph 812, this combination causes the interpolated line to deviate from the original interpolation (e.g., from FIG. 8a) shown as line 814 and to instead travel along a modified interpolation path shown as line 816. In one embodiment, in response to the detection of a zero crossing point in a PM baseband signal, a phase switching detector (e.g., corresponding to phase switching detector 704 in FIG. 7a) may be configured to provide an "after correction" command to a magnitude interpolation circuit. The "after correction" command causes the magnitude interpolation circuit to replace the sample immediately before the detected switching point time (e.g., sample $Y_1$) with a negative equivalent of the sample value, $-Y_1$, so as to modify the interpolation interval immediately after the switching point time as described above.

Figure 9:
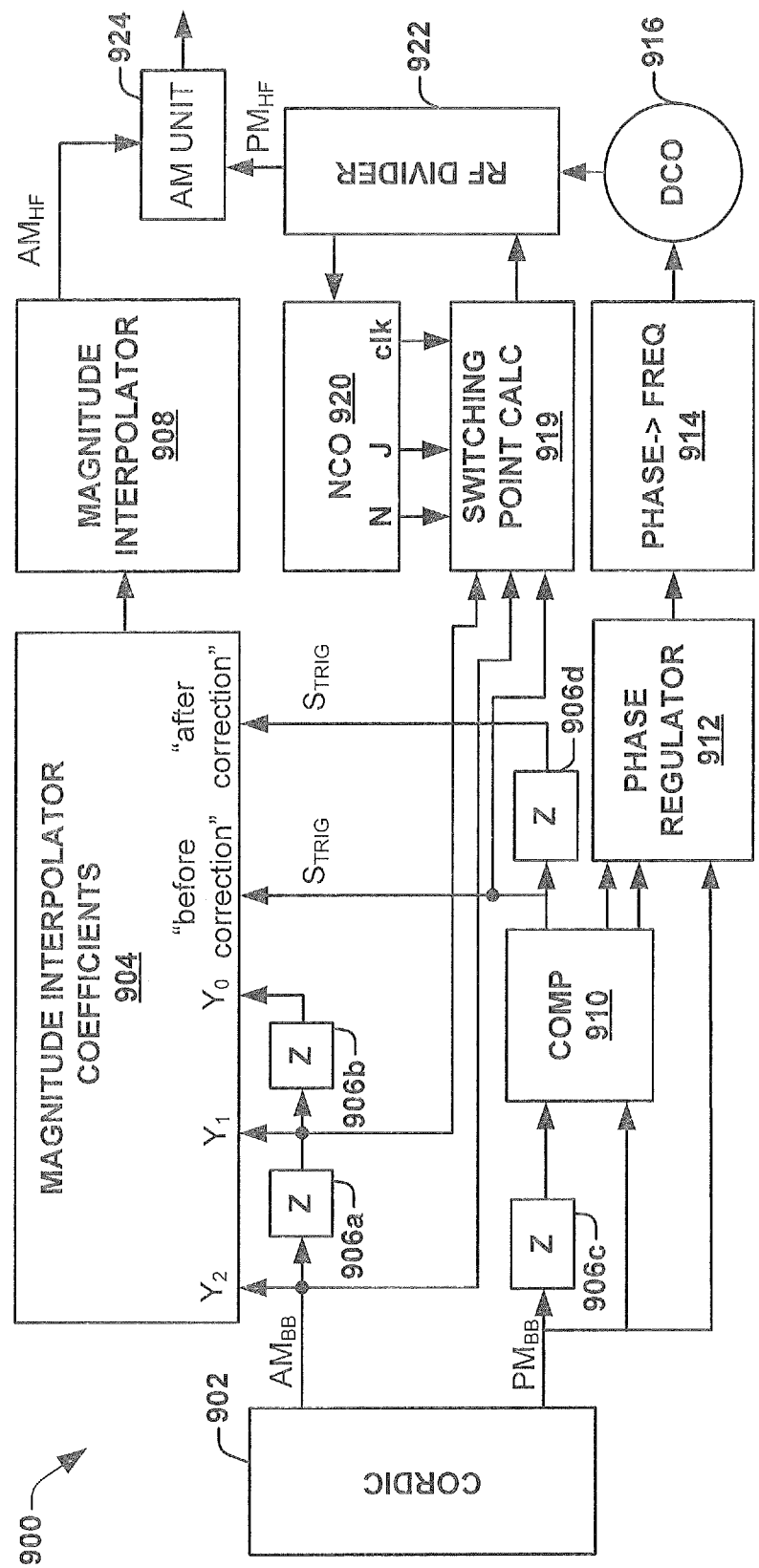
FIG. 9 illustrates a block diagram of another embodiment of a polar modulation circuit configured to perform synchronous AM and PM modulation.

FIG. 9 illustrates a more detailed block diagram of a polar modulation circuit 900 configured to synchronize AM and PM signals. As shown in FIG. 9, input data I and Q samples are provided to a CORDIC 902 configured to generate a baseband amplitude modulated (AM) signal $AM_{BB}$ and a baseband phase modulated (PM) signal $PM_{BB}$.

In the amplitude path, the AM baseband signal is provided to a magnitude interpolator coefficient block 904 which stores samples of the AM baseband signal from various clock periods. For example, a sample of the AM baseband signal at a first clock period $Y_2$ may be provided directly from the CORDIC, while delay element 906a causes the magnitude interpolator coefficient block 904 to receive samples of the AM baseband signal at a second clock period $Y_1$ and delay element 906b causes the magnitude interpolator coefficient block 904 to receive samples of the AM baseband signal at a third clock period $Y_0$.

As described above in FIGS. 8a-8c, trigger signals $S_{TRIG}$ comprising both a "before correction" signal and an "after correction" signal are provided to the magnitude interpolator coefficient block. In particular, the "before correction" signal may be directly generated by a comparator 910, while the "after correction" signal may be produced delaying the "before correction" signal by one digital clock period, using delay element 906d. Based upon the received AM baseband signal samples and the "before correction" and "after correction" signals, the magnitude interpolator coefficient block 906 may calculate interpolation coefficients that are provided to a magnitude interpolator 908 that performs interpolation of the AM baseband signal (e.g., as described in FIG. 8b or 8c) based upon the calculated interpolation coefficients.

In the phase path, a phase switching detector comprising a comparator 910 is configured to compare samples of the PM baseband signal $PM_{BB}$ from adjacent clock periods. For example, delay element 906c causes the comparator 910 to receive PM baseband signal samples from adjacent clock periods. The PM baseband signal samples are compared to detect a phase shift indicative of a symbol transition causing a phase discontinuity (e.g., to detect a zero crossing point). For example, in one embodiment the comparator 910 is configured to detect a phase shift between the PM baseband signal samples of adjacent clock periods that is greater than or less than 90°. If a phase shift of greater than or less than 90° (e.g., a phase shift from a phase offset of 225° to a phase offset of 45°) a symbol transition causing a zero crossing point is detected and the comparator 910 provides one or more trigger signals $S_{TRIG}$ to the magnitude interpolator coefficient block 904, which cause the block to compute a zero amplitude point in the interpolated high frequency AM signal.

Figure 10:
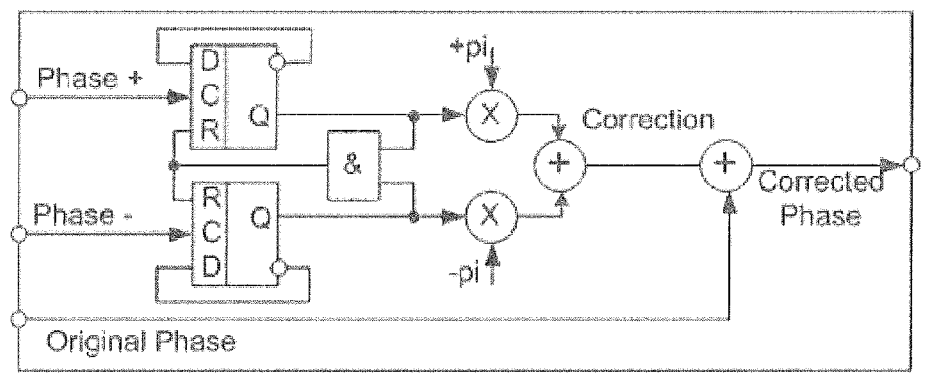
FIG. 10 illustrates a block diagram of a more particular example of phase regulator.

The comparator 910 is also configured to output the results of the comparison to a phase regulator 912, which is configured to regulate (e.g., remove) phase modulation in the PM baseband signal and thereby eliminate large phase offset discontinuities (e.g., phase shifts of 180°) caused by symbol transitions, as described above (e.g., in relation to FIGS. 6a and 6b). FIG. 10 illustrates a particular embodiment of an exemplary phase regulator 1000 configured to provide a 180° phase shift to the PM baseband signal upon detection of a large change in phase offset by the comparator 910. The phase regulator 1000 is configured to receive either a "Phase+" or a "Phase−" signal from the comparator 910, which clocks respective flip flop circuits. Depending on the input signal "Phase+" or "Phase−" the phase regulator increases or decreases the original phase value by 180°. If two successive plus, minus or plus/minus commands are provided to the phase regulator, the resulting phase shift is returned to 0° by the AND gate.

A resulting regulated phase signal is provided to a phase to frequency converter 914 configured to convert the regulated phase signal to the frequency domain to drive operation of the DCO 916 to generate a high frequency carrier signal (e.g., having a constant phase). The high frequency carrier signal is provided to an RF divider 922 configured to generate a phase shift that introduces phase modulation into the high frequency carrier signal.

A switching point calculator 918 is configured determine a switching point time. In one embodiment, the switching point calculator 918 is configured to receive AM baseband samples $Y_1$ and $Y_2$ and compare them. Based upon the comparison the switching point calculator 918 determine a switching time at which the RF divider 922 is to introduce a phase modulation into the high frequency carrier signal. The switching point calculator 918 then outputs a control signal at the switching point time, to operate the RF divider 922 to introduce a phase offset into the high frequency carrier signal.

Figure 11:
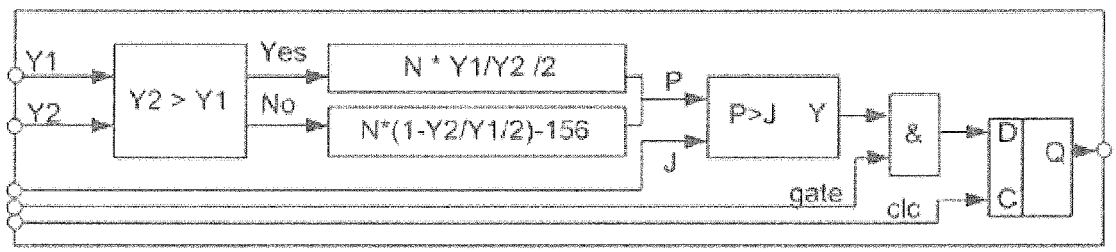
FIG. 11 illustrates a block diagram of a more particular example of switching point calculator.

One example of a block diagram of a switching point calculator 918 is illustrated in FIG. 11. As shown in FIG. 11, the switching point calculator 1100 may be configured to compare the values of samples $Y_1$ and $Y_2$ and calculate (e.g., from linear interpolation) a number of clock pulse (P) at which a zero amplitude point may occur. A numerically controlled oscillator (NCO) (e.g., element 920 in FIG. 9) is configured to provide a current clock pulse number (J) to the switching point calculator, which may be compared with a calculated pulse number (P). Overcoming the calculated pulse number generates the control signal for divider 922 to perform the phase change (e.g., of 180 degrees).

In one embodiment, the trigger signal $S_{TRIG}$ output from the comparator 910 may be provided to the switching point calculator 1100. The trigger signal $S_{TRIG}$ may be used as a "gate" signal that is feed into an AND gate. The output of the AND gate will allow for generation of a control signal when the comparator detects the zero crossing point (e.g., a phase change greater than or less than 90°), thereby guaranteeing that a control signal for divider 922 is not generated without detection of a zero crossing point. In another embodiment, to guarantee RF synchronization the control signal may triggered with RF clock signal (clc) provided by the NCO 920.

An amplitude modulation unit 924 (e.g., power amplifier. TX mixer, etc.) is configured to receive the high frequency AM signal $AM_{HF}$ and the high frequency PM signal $PM_{HF}$. The amplitude modulation unit 924 modulates the high frequency PM signal with the interpolated, high frequency AM signal prior to generate a polar modulated signal that is output from the transmission chain (e.g., to an antenna). In one embodiment the amplitude modulation unit 924 may comprise a power amplifier configured to receive the high frequency PM signal $PM_{HF}$ as an input and the interpolated, high frequency AM signal $AM_{HF}$ as a control signal.

Figure 12:
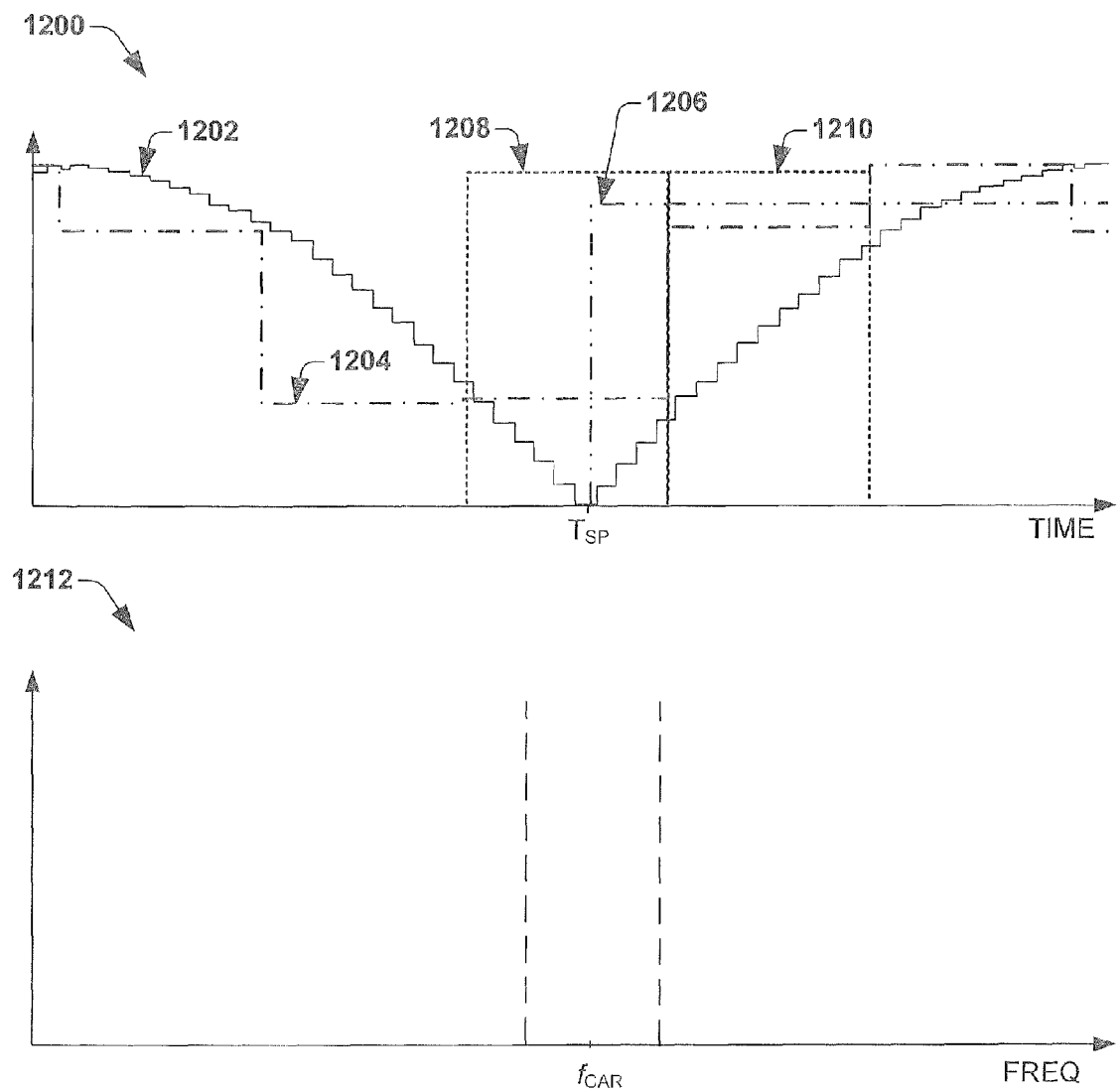
FIG. 12 is a graph showing simulation results of the polar modulation circuit of FIG. 9.

FIG. 12 illustrates graphs showing a simulation result of the AM-PM synchronization circuit of FIG. 9. In particular, graph 1200 shows internal signals in the polar modulation circuit 900, while graph 1212 illustrates a resultant spectrum of double sideband modulation achieved using the AM-PM synchronization illustrated in graph 1200 (e.g., having a phase shifting of 180° that gives a low frequency component and high frequency component).

Referring to graph 1200, an interpolated high frequency AM signal 1202 is interpolated between AM baseband samples 1204 so as to follow the general trend of the AM samples (i.e., green lie is interpolation between points of magenta line). However, in contrast to the AM baseband samples 1204, the interpolated high frequency AM signal 1202 goes to a zero amplitude point at switching point time $T_{SP}$. When the interpolated high frequency AM signal 1202 reaches a zero amplitude, a control signal 1206 is driven to a high value that causes the phase modulation shown in graph 1212. Therefore, lines 1202 and 1206 illustrate synchronization between AM and PM signals in polar modulation circuit 900.

Graph 1200 also illustrates a "before correction" signal 1208 and an "after correction" signal 1210 (e.g., described above in FIGS. 8b and 8c in more detail). During the time when the "before correction" signal 1208 is high, interpolation is computed based upon a negative equivalent of the AM baseband samples 1204 immediate after the switching point time $T_{SP}$. Similarly, during the time when the "after correction" signal is high, interpolation is computed based upon a negative equivalent of the AM baseband samples 1204 immediately before the switching point time $T_{SP}$.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A polar modulation circuit, comprising:
an amplitude conversion component configured to generate a high frequency amplitude modulated signal having a substantially zero amplitude at a switching point time that corresponds to a symbol transition causing a phase discontinuity in a phase modulated baseband signal, and further configured to generate a control signal at the switching point time; and
a phase modulation component configured to receive the control signal and based thereupon to perform a high frequency phase modulation on a high frequency carrier signal at the switching point time,
wherein the amplitude conversion component is configured to generate the high frequency amplitude modulated signal by interpolating a plurality of amplitude modulated baseband signal samples to generate a data point having the substantially zero amplitude at the switching point time,
wherein the switching point time is temporally located between a first time that a first amplitude modulated baseband signal sample is taken and a second time when a second amplitude modulated baseband signal sample is taken, and
wherein the symbol transition comprises a phase shift of 180° in a phase modulated baseband signal occurring between the first and second time.

2. The circuit of claim 1, wherein the high frequency phase modulation comprises a phase shift of 180° so that the high frequency amplitude modulated signal has the substantially zero amplitude at the same time that a high frequency phase modulated carrier signal has a phase shift of 180°.

3. The circuit of claim 2, wherein the phase modulation component comprises:
a phase regulator configured to receive a phase modulated baseband signal and to generate a phase regulated signal by regulating a digital phase modulation of the phase modulated baseband signal;
a controlled oscillator configured to receive the phase regulated signal and generate the high frequency carrier signal based thereupon; and
a high frequency phase modulation component configured to generate the high frequency phase modulated carrier signal by performing the high frequency phase modulation on the high frequency carrier signal at the switching point time.

4. The circuit of claim 3, further comprising:
an amplitude modulation unit located downstream of the high frequency phase modulation component, the amplitude modulation unit configured to introduce the high frequency amplitude modulated signal into the high frequency phase modulated signal.

5. The circuit of claim 1, further comprising a phase switching detector comprising a comparator configured to detect the phase discontinuity when phase offset changes in samples taken from adjacent clock cycles of the phase modulated baseband signal have an absolute value of greater than 90°,
wherein upon detecting the phase discontinuity the comparator triggers interpolating the plurality of amplitude modulated baseband signal samples.

6. The circuit of claim 5, wherein if the phase switching detector detects the phase offset having an absolute value of greater than 90°, it generates a first trigger signal that causes the interpolation to be performed with a negative equivalent of an amplitude modulated baseband signal sample immediately after the switching point time, so as to modify the interpolation to generate the data point having a substantially zero amplitude.

7. The circuit of claim 6, wherein if the phase switching detector detects the phase offset having an absolute value of greater than 90°, it generates a second trigger signal that causes the interpolation to be performed with a negative equivalent of an amplitude modulated baseband signal sample immediately before the switching time, so as to modify an interpolation interval after the switching point time.

8. The circuit of claim 1, wherein the amplitude conversion component further comprises a switching point calculator configured to calculate a number of clock pulses until the amplitude modulated signal has a zero amplitude based upon a comparison between AM signal samples, wherein the switching point calculator generates the control signal when a number of clock pulses is greater than or equal to the calculated number of clock pulses.

9. A polar modulation circuit, comprising:
a magnitude interpolator configured to generate a high frequency amplitude modulated signal by interpolating a plurality of amplitude modulated baseband signal samples to generate a data point having an amplitude that is substantially zero at a switching point time and further configured to generate a control signal at the switching point time;
a phase regulator configured to receive a phase modulated baseband signal and to generate a phase regulated signal by regulating phase modulation in the phase modulated baseband signal;
a controlled oscillator configured to receive the phase regulated signal and generate a high frequency carrier wave based thereupon; and
a high frequency phase modulation component configured to receive the control signal and based thereupon to introduce a high frequency phase modulation comprising a phase shift of 180° into the high frequency carrier signal at the switching point time to generate a high frequency phase modulated carrier signal,
wherein the switching point time is temporally located between a first time that a first amplitude modulated baseband signal sample is taken and a second time when a second amplitude modulated baseband signal sample is taken, and
wherein a symbol transition having a phase shift of 180° in a phase modulated baseband signal occurs between the first and second time.

10. The circuit of claim 9, wherein regulating phase modulation comprises introducing a digital phase offset into the phase modulated baseband signal that acts in concert with the high frequency phase modulation to generate the high frequency phase modulated carrier signal.

11. The circuit of claim 9, further comprising a phase switching detector configured to detect the phase shift of 180° in the phase modulated baseband signal, and upon detection of the phase shift of 180° to provide one or more trigger signals to the magnitude interpolator that causes the magnitude interpolator to perform the interpolation with an amplitude modulated baseband signal sample immediately before the detected symbol transition replaced with a negative equivalent and an amplitude modulated baseband signal sample immediately after the detected symbol transition replaced with a negative equivalent.

12. The circuit of claim 9, further comprising:
sample and a second phase modulated baseband signal sample operated upon by a delay element configured to delay the second sample by one clock cycle, wherein the comparator compares the first and second samples to detect a phase offset between the samples having an absolute value of greater than 90°, and wherein if a phase offset with an absolute value of greater than 90° is detected, the comparator is configured to generate trigger signals that cause the magnitude interpolator to perform an interpolation by modifying amplitude modulated baseband signal samples temporally located immediately prior to and immediately after the phase offset with an absolute value of greater than 90°.

13. The circuit of claim 9, further comprising one or more delay elements configured to act upon a received amplitude modulated baseband signal to delay the amplitude modulated baseband signal from various clock periods so that the magnitude interpolator receives amplitude modulated baseband signal samples from different clock periods.

14. The circuit of claim 9, further comprising:
an amplitude modulation unit located downstream of the high frequency phase modulation component, the amplitude modulation unit configured to introduce the high frequency amplitude modulated signal into the high frequency phase modulated signal.

15. A method of polar modulation, comprising:
providing an amplitude modulated baseband signal and a phase modulated baseband signal;
generating a phase regulated signal by regulating phase modulation information in the phase modulated baseband signal;
up-converting the phase regulated signal to a high frequency carrier signal;
interpolating the amplitude modulated baseband signal to generate a high frequency amplitude modulated signal having a zero amplitude point at a switching point time;
selectively introducing a high frequency phase modulation into the high frequency carrier signal at the switching point time to generate a high frequency phase modulated carrier signal; and
generating a control signal that controls the introduction of the phase modulation in the high frequency carrier signal so that the high frequency amplitude modulated signal has the zero amplitude point at the same time that the high frequency phase modulated carrier signal has a phase change of 180°.

16. The method of claim 15, wherein modifying the amplitude modulated baseband signal comprises interpolating a plurality of amplitude modulated baseband signal samples to generate the zero amplitude point between two samples taken at times between which a symbol transition causing a phase discontinuity in the phase modulated baseband signal occurred, wherein the interpolation is performed by modifying the amplitude of the amplitude modulated baseband signal sample temporally located prior to or after the switching point time.

17. The method of claim 15, wherein regulating phase modulation information comprises introducing a digital phase offset into the phase modulated baseband signal and introducing an additional high frequency phase offset into the high frequency carrier signal.

* * * * *